United States Patent
Sakuraba

(10) Patent No.: US 7,990,234 B2
(45) Date of Patent: Aug. 2, 2011

(54) ELASTIC WAVE FILTER

(75) Inventor: Yoichi Sakuraba, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 195 days.

(21) Appl. No.: 12/284,664

(22) Filed: Sep. 24, 2008

(65) Prior Publication Data

US 2010/0127800 A1   May 27, 2010

(30) Foreign Application Priority Data

Sep. 28, 2007  (JP) .................. 2007-255946

(51) Int. Cl.
  *H03H 9/64*   (2006.01)
(52) U.S. Cl. ............... 333/195; 310/313 D; 333/193
(58) Field of Classification Search ........ 333/193–196; 310/313 B
See application file for complete search history.

(56) References Cited

U.S. PATENT DOCUMENTS

| | | | | |
|---|---|---|---|---|
| 4,166,258 A | * | 8/1979 | Tseng ...................... | 333/195 |
| 5,486,800 A | * | 1/1996 | Davenport ................ | 333/193 |
| 5,632,909 A | * | 5/1997 | Allen et al. ............... | 216/41 |
| 5,638,036 A | * | 6/1997 | Penunuri et al. .......... | 333/194 |
| 5,682,126 A | * | 10/1997 | Plesski et al. ............. | 333/193 |
| 7,414,494 B2 | * | 8/2008 | Nakazawa et al. ........ | 333/133 |
| 7,482,895 B2 | * | 1/2009 | Igaki et al. ................ | 333/195 |
| 2005/0206272 A1 | * | 9/2005 | Inoue et al. ............... | 310/313 B |
| 2005/0212620 A1 | * | 9/2005 | Bauer et al. ............... | 333/193 |

FOREIGN PATENT DOCUMENTS

| | | | |
|---|---|---|---|
| JP | 8-265099 | * | 10/1996 |
| JP | 9-232908 | * | 9/1997 |
| JP | 9-270663 | * | 10/1997 |
| JP | 10-303691 | * | 11/1998 |
| JP | 2000-31780 | | 1/2000 |
| WO | WO 2005/013481 | * | 2/2005 |

* cited by examiner

*Primary Examiner* — Barbara Summons
(74) *Attorney, Agent, or Firm* — Jordan and Hamburg LLP

(57) ABSTRACT

The object of the present invention is to provide an elastic wave filter capable of suppressing deterioration of a pass band and realizing to downsize. In the elastic wave filter of the present invention provided with a circuit, to which elastic wave resonators of a first series arm, a second series arm and a parallel wave are connected, the first series arm and one out of the second series arm and the parallel arm are arranged in the lateral direction in a row to be adjacent to each other, and the other out of the second series arm and the parallel arm is disposed on the rear side of the row, and prescribed bus bars in the first series arm, the second series arm and the parallel arm are arranged on the common connection point side.

10 Claims, 10 Drawing Sheets

(a)

(b)

(a)

(b)

(a)

(b)

RELATED ART

ELASTIC WAVE FILTER

BACKGROUND OF THE INVENTION

1. Field of the Invention

The present invention relates to an elastic wave filter provided with an elastic wave resonator such as a surface acoustic wave (SAW) resonator or the like.

2. Description of the Related Art

For the elastic wave filter installed on a mobile terminal such as a cellular phone or the like and performing distinction of frequency signals, a ladder type filter 100 having a configuration such that a constant-K circuit taking a series arm 101 and a parallel arm 102 for a base section as shown in FIG. 9 is formed, and plural sets of the base section 103 of the constant-K circuit are connected in series is adopted. Then, it becomes possible to allow a signal having a specific frequency to pass through by making a resonance frequency of the series arm 101 and an anti-resonance frequency of the parallel arm 102 in the base section 103 nearly consistent with each other.

For the series arm 101 and the parallel arm 102 like these, SAW resonators or the like which are easy to downsize and capable of simultaneously forming plural resonators by a photolithography technology are often adopted. In such a case, for instance, as shown diagrammatically in FIG. 9, the base section 103 of the constant-K circuit is modularized by simultaneously forming these resonators 101 and 102 above a common chip or the like to configure a ladder type filter 100 by connecting plural resonator modules 110.

FIG. 10 is a plan view showing a configuration of the conventional resonator module 110, and the base sections 103a and 103b worthy of two sections shown in FIG. 9 are installed in the resonator module 110. Note that the following explanation will be made in taking the upper side facing the drawing as a front side and taking the lower side as a rear side. The resonator module 110 shown in FIG. 10 is patterned in a manner that three rectangular electrode units 111a, 111b and 121 including an interdigital transducer (IDT) electrode and reflectors provided on both sides thereof are aligned parallel in front and behind and these are connected with a signal line 132 to each other. The SAW resonator is configured with these electrode units 111a, 111b and 121, and an under layered piezoelectric substrate 131. These SAW resonators serve as the series arms 101a and 101b of the base sections 103a and 103b of the constant-K circuit shown in FIG. 9 by connecting the front side electrode unit 111a to an input port 136 and the rear side electrode unit 111b to an output port 137. Also by grounding the middle stage side electrode unit 121, the SAW resonator in question serves as the parallel arm 102 of the constant-K circuit. Note that the parallel arm 102 shown on the middle stage in FIG. 10 serves as a roll worthy of two parallel arms 102a and 102b corresponding to the respective base sections 103a and 103b shown in FIG. 9 with this one arm.

The resonator module 110 shown in FIG. 10 is formed above the piezoelectric substrate 131 of about 1.0 mm×1.5 mm for instance. Although downsizing has been tried up to now, empty spaces S1 through S4 surrounded by an alternate long and short dash line in the drawing are still reserved, and therefore there is a space capable of further downsizing. For instance, the empty spaces S1 and S2 are formed by largely bulged out by a wide signal line 132 connecting the front side series arm 101a and the rear side series arm 101b toward left of an area where the respective electrode units 111a, 111b and 121 are arranged. The empty spaces S3 and S4 are formed by a difference in size (difference in width in the present example) of the respective electrode units 111a, 111b and 121 between the series arms 101a, 101b and the series arm 101. The whole resonator modules are covered with, for instance, a metal cover, but the illustration thereof is omitted for the sake of convenience.

Here, "133a through 133d" in FIG. 10 are alignment marks for direction recognition of the resonator module 110, "134" is a patterning finish-recognition pattern and "135" is an identification code for identifying an item number or the like of the resonator module 110, and these are provided in the above-described empty spaces S1 through S4. The empty spaces S1 through S4 are used also as an area to provide information for managing the resonator module 110 in this manner, but there are many unnecessary spaces where are not used completely. Therefore, it is necessary to minimize such an unnecessary space as much as possible for further downsizing of the resonator module 110.

The empty spaces S1 through S4 like these are seemed to be cancelled by narrowing the signal line 132 or making the size of the respective electrode units 111a, 111b and 121 uniform. However, the width of the signal line 132 is determined from the viewpoint of reducing an ohmic loss (resistance loss) of the signal, and the size of the respective electrode units 111a, 111b and 121 serve as a design parameter regarding characteristics (such as resonance frequency or the like) of the series arms 101a, 101b and the parallel arm 102. Therefore, it is impossible to determine any of these values from the viewpoint of canceling the empty spaces S1 through S4.

In addition, as a problem separated from the above-described empty spaces S1 through S4, there comes up another problem in a manner that when the signal line 132 having a large area shown in FIG. 10 is adopted from the viewpoint of preventing the ohmic loss, parasitic capacitance of the signal line 132 also increases, which leads to deterioration of a pass band of the filter.

Note that in Patent Document 1, a ladder type filter omitting a space to dispose an extra signal line by using a reflector of a parallel arm resonator as a signal line connecting between the IDT electrodes of a series arm resonator is described. However, electrode fingers provided in a large number to a reflector are very thin of about several µm for instance, and the use of such a thin electrode finger as the signal line may lead to a large ohmic loss and it is not realistic. On the other hand, since the area of the whole reflector is large even when compared with a conventional signal line, the parasitic capacitance becomes large and the bass band of the filter is deteriorated.

Japanese Patent Laid-open No. 2000-31780: 0023th paragraph, FIG. 1

SUMMARY OF THE INVENTION

The present invention has been achieved under the above-described circumstances, and an object thereof is to provide an elastic wave filter capable of suppressing deterioration of a pass band and capable of realizing downsizing.

The elastic wave filter relating to the present invention and provided with a circuit in which a first series arm elastic wave resonator, a second series arm elastic wave resonator and a parallel arm elastic wave resonator are connected to a common connection point, including:

configuring the elastic wave resonator for the first series arm with a first bus bar and a second bus bar provided above a piezoelectric substrate in front and behind while facing each other, and an IDT electrode provided between these pass bars;

one out of said second series arm elastic wave resonator and said parallel arm elastic wave resonator, which includes a third bus bar and a fourth bus bar provided above the piezoelectric substrate in front and behind while facing each other and the IDT electrode provided between these bus bars, and which is positioned adjacent to said first series arm elastic wave resonator in the lateral direction.

the other out of said second series arm elastic wave resonator and said parallel arm elastic wave resonator, which includes a fifth bus bar and a sixth bus bar provided above the piezoelectric substrate in front and behind while facing each other and the IDT electrode provided between these bus bars, and which is positioned on the rear side of a row composed together with said first series arm elastic wave resonator and the one out of said second series arm elastic wave resonator and said parallel arm elastic wave resonator, wherein the second bus bar, the fourth bus bar and the fifth bus bar are positioned on the common connection point side.

Here, the fourth bus bar is preferably configured with a region that is extension of the second bus bar, and the fifth bus bar is preferably made in common with the second bus bar and the fourth bus bar.

The elastic wave filter preferably configured, including:

taking a constant-K circuit composed of the series arm elastic wave resonator and the parallel arm elastic wave resonator as a base section, and connecting two or more of the base section in a ladder type;

making the series arm elastic wave resonator contained in a first base section where the parallel arm elastic wave resonator is positioned on the output side, serve as the first series elastic wave resonator; and making the series arm elastic wave resonator adjacent to the first base section, and contained in a second base section where the parallel arm elastic wave resonator is positioned on the input side serve as the second series arm elastic wave resonator.

Further, it is preferable that the elastic wave filter is configured such that the first series arm elastic wave resonator and the second series arm elastic wave resonator are arranged in a row in the lateral direction; and the parallel arm elastic wave resonator contained in the base section is positioned on the rear side of the row of the first series arm elastic wave resonator and the second series arm elastic wave resonator.

Furthermore, it is preferable to configure such that a first elastic wave filter and a second elastic wave filter composed of the above-described elastic wave filters are connected to each other, and these elastic wave filters are arranged in a manner that the sixth bus bar provided on the first elastic wave filter and the sixth bus bar provided on the second elastic wave filter are extended in parallel adjacent to each other, and the sixth bus bars of the respective elastic wave filters are connected to each other. In addition to that, the sixth bus bar of the first elastic wave filter and the sixth bus bar of the second elastic wave filter are made in common. At this time, the whole IDT electrodes and the bus bars of the first elastic wave filter and the second elastic wave filter are preferably provided on a common piezoelectric substrate.

Apart from this, it is possible to configure a resonator module with a circuit composed of the first series arm elastic wave resonator, the second series arm elastic wave resonator and the parallel arm elastic wave resonator of the respective elastic wave filters using a piezoelectric substrate for modules, and a plurality of the resonator modules may be installed above a wiring substrate.

Other than this, when two bus bars and the IDT electrode in the respective elastic wave resonators are taken as an electrode unit, the ratio of the sum areas of disposing areas of the electrode unit of these respective elastic wave resonators to the area of a rectangular area where the electrode units of the respective elastic wave resonators of the first series arm, the second series arm and the parallel arm is suitably 0.8 or more, and a reflector disposed along with the IDT electrode may be included in the electrode unit.

According to the present invention, since two elastic wave resonators are arranged adjacent to each other in the lateral direction out of three elastic wave resonators composing the first and the second series arms and the parallel arm connected each other at a common connection point and the remaining one is positioned on the rear side of these rows, it is possible to place the bus bars of the respective elastic wave resonators connected to the common connection point close to each other. As a result, it becomes possible to shorten the signal line to become a connection point of these bus bars, it is possible to keep the empty space created by routing through the signal line small and to further downsize the elastic wave filter. When bus bars of the respective elastic wave resonators are made in common to use as the signal line, it becomes possible to cancel the empty space caused by routing through the signal line and to further reduce the elastic wave filter.

Furthermore, by shortening the signal lines as described above and using the bus bar for the signal line, it becomes possible to suppress deterioration of the pass band of the filter due to signal loss and increase of the parasitic capacitance caused by the ohmic loss, which contributes to improvement in performance of the filter, compared with the case of routing through a wide and long signal line.

DETAILED DESCRIPTION OF THE PREFERRED EMBODIMENT(S)

Figure 1:
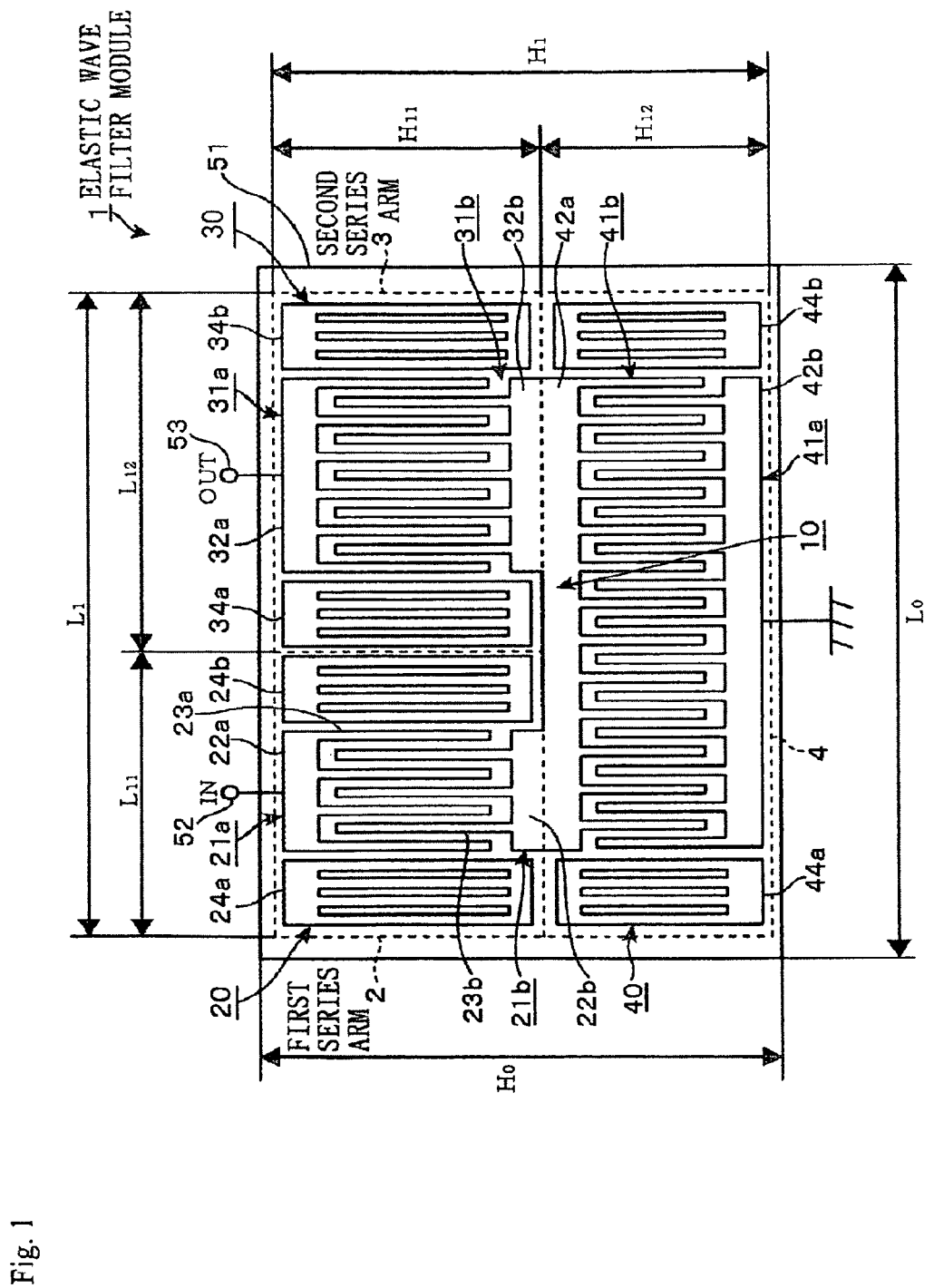
FIG. 1 is a plan view showing a configuration of a resonator module relating to an embodiment.

Hereinafter, as an embodiment relating to the present invention, a resonator module using a SAW resonator as an elastic wave resonator will be explained. FIG. 1 is a plan view of a resonator module 1 relating to the present embodiment.

Figure 9:
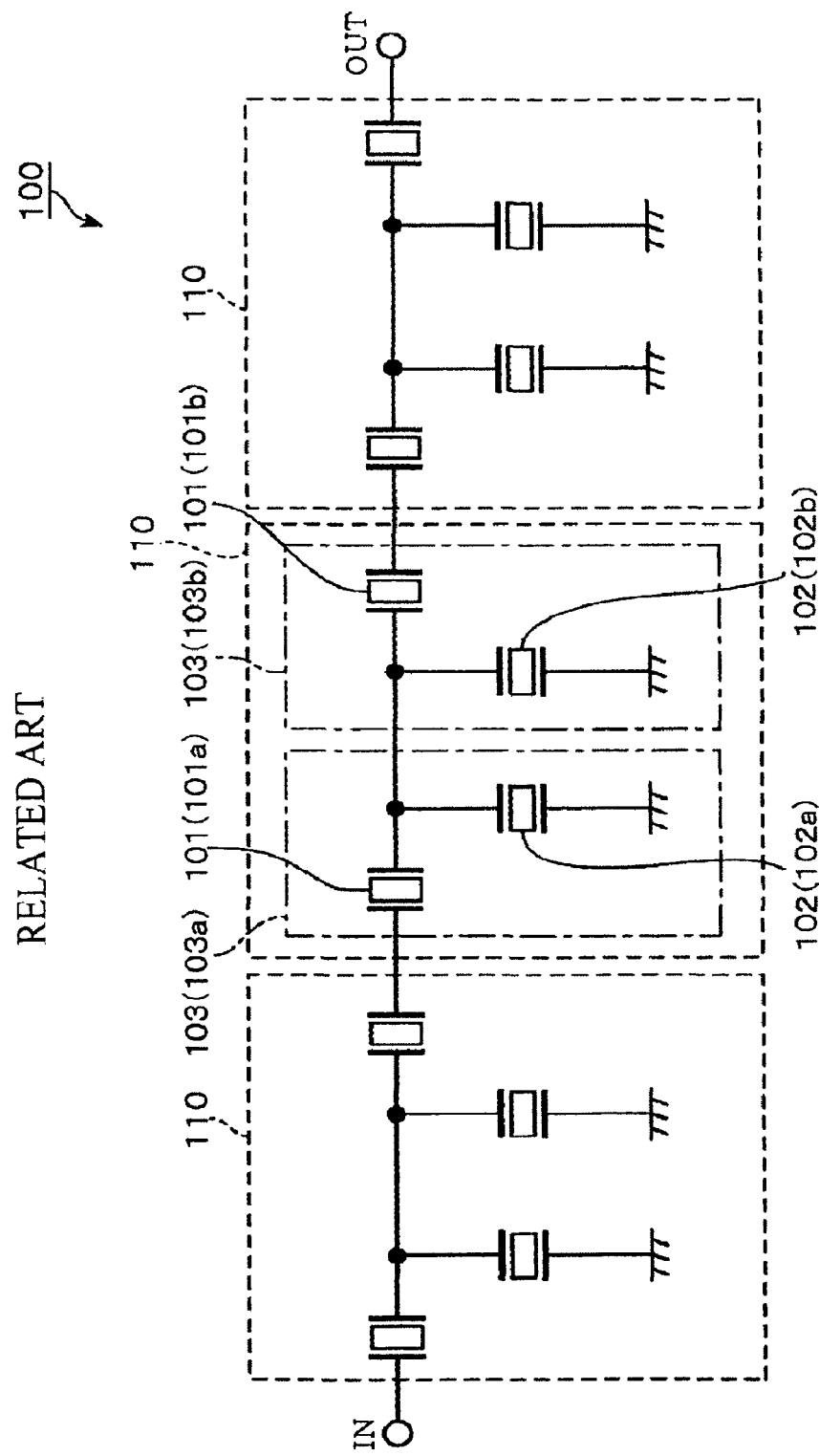
FIG. 9 is a circuit diagram showing a configuration example of the ladder type filter.

The resonator module 1 is configured as a constant-K circuit including two series arms 2 and 3, a parallel arm 4 used in these series arms 2 and 3 in common, and two sets of base sections 103a and 103b shown in FIG. 9 are modularized. In order to distinguish between two series arms 2 and 3, the series arm connected to an input port 52 to be described later is called a first series arm 2, and the series arm connected to an output port 53 is called a second series arm 3.

The first series arm 2, the second series arm 3 and the parallel arm 4 are configured from known SAW resonators respectively, and since they have nearly the same configurations except their sizes and mutual connection points, the configuration of the first series arm 2 will be explained as a typical example for these arms. The first series arm 2 is formed by disposing an electrode unit 20 in a prescribed area on a piezoelectric substrate 51 such as $LiTaO_3$, $LiNbO_3$, $SiO_2$ or the like. The electrode unit 20 includes IDT electrodes 21a and 21b, and reflectors 24a and 24b arranged on both sides of these IDT electrodes 21a and 21b.

The IDT electrodes 21a and 21b are shaped such that many electrode fingers 23a and 23b are connected in a comb teeth shape to a slender rectangular bus bars (a first bus bar 22a and a second bus bar 22b) provided in front and behind while facing each other, and have a configuration in a manner that the mutual electrode fingers 23a and 23b are crossed each other in a crossed finger shape so that they are relatively disposed in the longitudinal direction. The first bus bar 22a on the front side out of these IDT electrodes 21a and 21b is connected to the input port 52, and the second bus bar 22b on the rear side is connected to another resonator (the second series arm 3 and the parallel arm 4). Through this configuration, an electric signal input into the front side IDT electrode 21a is electromechanically converted between the crossed electrode fingers 23a and 23b to become an elastic surface wave (SAW), and propagates through the surface of the piezoelectric substrate 51 to be inversely converted by the opposed rear side IDT electrode 21b so as to be taken out again as the electric signal.

The reflectors 24a and 24b act a roll in reflecting the SAW propagated on both outsides of the IDT electrodes 21a and 21b, and trap the SAW in the reflectors 24a and 24b. These IDT electrode 21a and 21b, and the reflectors 24a and 24b are simultaneously formed with other electrode units 30 and 40 by patterning an electrode member made of, for instance, aluminum by photolithography. The electrode unit 20 composed of the IDT electrodes 21a and 21b, and the reflectors 24a and 24b is a rectangular of "$H_{11}$ in height×$L_{11}$ in width" as a whole.

The second series arm 3 has a configuration similar to the first series arm 2. However, a third bus bar 32a on the front side out of bus bars 32a and 32b arranged in front and behind while facing each other is connected to the output port 53, and a fourth bus bar 32b on the rear side differs from the first series arm 2 in that it is connected to other resonators (the first series arm 2 and the parallel arm 4) and the width of the electrode unit 30 is "$L_{12}$ ($>L_{11}$)".

As for the parallel arm 4, its configuration is similar to the first series arm 2, but a fifth bus bar 42a on the front side out of bus bars 42a and 42b disposed in front and behind while facing each other is connected to other series arms 2 and 3, and a sixth bus bar 42b on the rear side differs from the configurations of the series arms 2 and 3 in that it is grounded and the size (size of the installation area) of the whole electrode unit 40 is "$H_{12}$ in height×$L_1$ (=$L_{11}$+$L_{12}$) in width".

Figure 10:
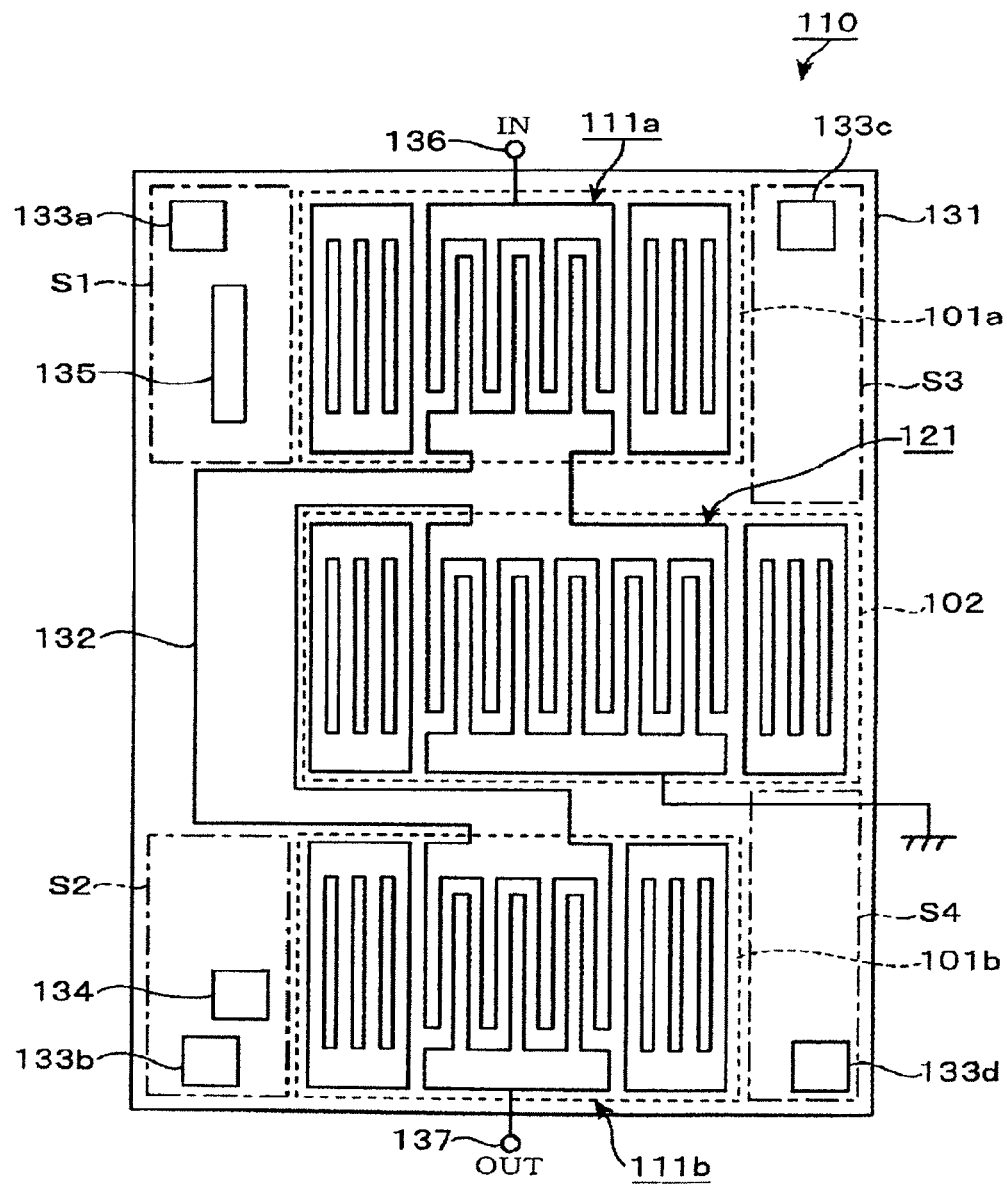
FIG. 10 is a plan view showing a conventional example of the resonator module.

Three SAW resonators 2 through 4 having the above configuration are arranged in a pattern different from the conventional resonator module 110 shown in FIG. 10 so as to suppress creation of the empty space explained in the related art, to downsize further the resonator module 1 and to improve its performance. Hereinafter, these arrangement patterns will be explained.

Regarding the arrangement patterns of the SAW resonators 2 through 4, the resonator module 1 relating to the present embodiment has a configuration in a manner that the first series arm 2 and the second series arm 3 are arranged side by side on the front side of the piezoelectric substrate 51 surface, and the parallel arm 4 is disposed on the rear side of a row of these first series arm 2 and the second series arm 3. By arranging the three SAW resonators 2 through 4 in this manner, the second and the fourth bus bars 22b and 32b of the series arms 2 and 3, which are connected to each other and the fifth bus bar 42a of the parallel arm 4 are adjacent to each other. Then further, these adjacent bus bars (the second bus bar 22b, the fourth bus bar 32b and the fifth bus bar 42a) are made in common to form a connection point (common bus bar 10) for the respective SAW resonators 2 through 4, and by using the common bus bar 10 for a signal line, it becomes possible to omit a space for routing through the signal line 132 in the conventional example, lest the empty spaces S1 and S2 shown in FIG. 10 should be created.

Further in the present embodiment, by forming the size of the respective electrode units 20 through 40 of the three SAW resonators 2 through 4 arranged as shown in FIG. 1 as described previously, it becomes possible to equalize the height of the two electrode units 20 and 30 aligned adjacently on the front side, and to true up the right and left outside end positions of these whole two electrode units 20 and 30, and the right and left outside end positions on the rear side electrode unit 40.

As a result, the whole three electrode units 20 through 40 can be placed within a rectangular area of "$H_1$ (=$H_{11}$+$H_{12}$) in height×$L_1$ in width", so that the resonator module 1 can be formed above the piezoelectric substrate 51 having nearly the same size as the rectangular area (for instance, $H_0$ ($\approx H_1$) in height×$L_0$ ($\approx L_1$) in width) (provided that $H_0 \geq H_1$, $L_0 \geq L_1$)). As a result, it becomes possible not to create empty spaces S3 and S4 due to differences in size of the SAW resonator shown in FIG. 10.

As described above, it is possible to realize an arrangement having scarcely any empty space by forming the shapes and sizes of the electrode units 20 through 40 of the series arms 2 and 3, and the parallel arm 4 as those in FIG. 1. However, as explained in the related art, since the height and the width of the respective electrode units 20 through 40 are design parameters for determining the characteristics of the SAW resonators 2 through 4, it does not necessarily follow that an ideally sized formation shown as in FIG. 1 can be designed. Therefore, an arrangement pattern in the case of the sizes of the electrode units 20 through 40 being not uniform like this will be explained below.

Figure 2:
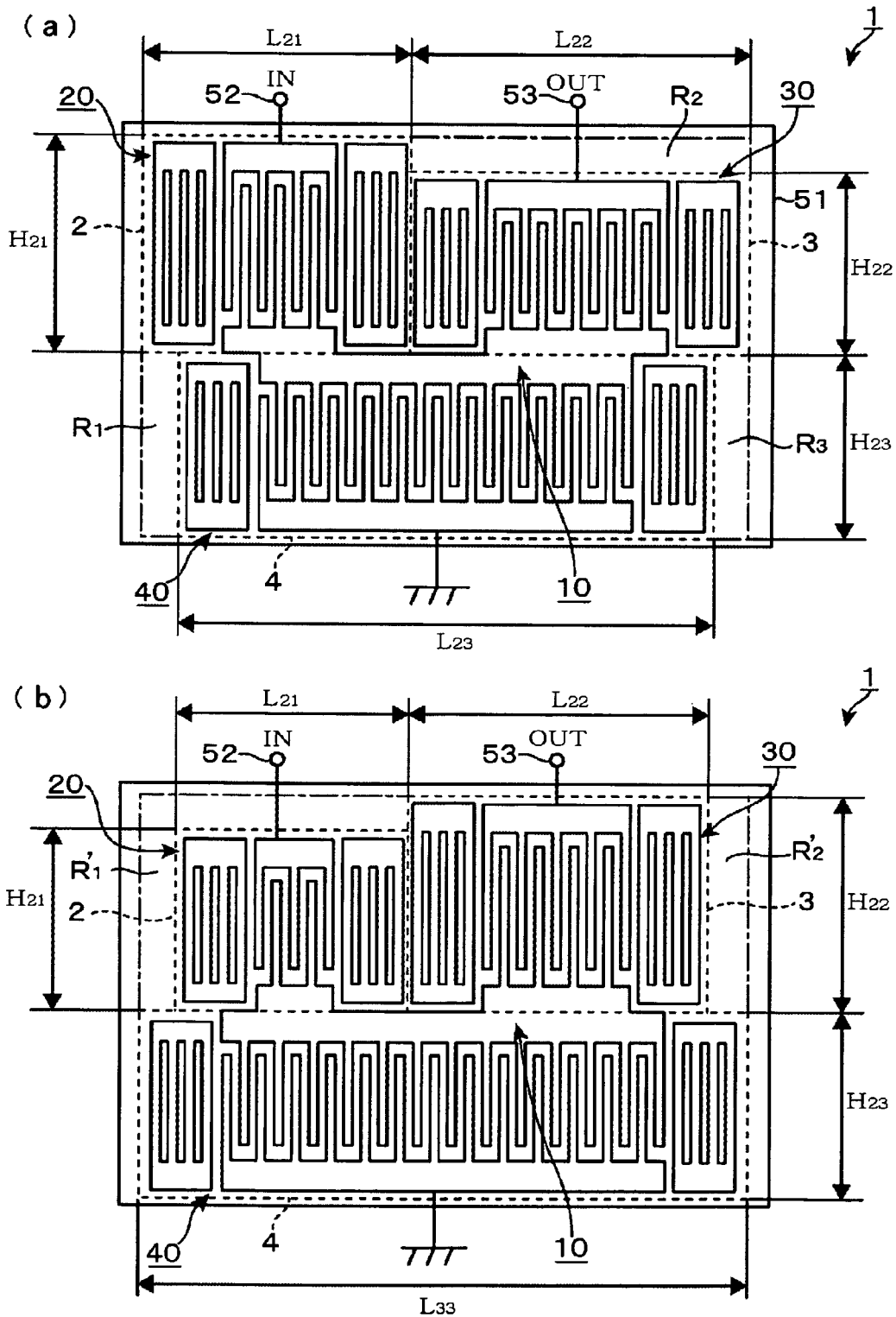
FIGS. 2A and 2B are plan views showing a modified example of the resonator module.

FIGS. 2A and 2B are plan views showing the case that the heights of the electrode units 20 and 30 are not uniform between the first series arm 2 and the second series arm 3, and the width of the electrode units 20 and 30 of the first series arm 2 and the second series arm 3 in total differs from the width of the electrode unit 40 of the parallel unit 4. In such a case, since the shape of the electrode units 20 through 40 of the whole of the first series arm 2, the second series arm 3 and the parallel arm 4 cannot be rectangular as shown in FIG. 1, empty spaces shown by $R_1$ through $R_3$ in FIG. 2A, and shown by $R'_1$ and $R'_2$ in FIG. 2B are created.

However, since the common bus bar 10 is made in common even in the case of FIG. 2A and FIG. 2B, an empty space due to routing through the signal line 132 as shown in FIG. 10 is not created. The respective electrode units 20 through 40 are arranged in a manner that the width of the electrode units 20 and 30 of the first series arm 2 and the second series arm 3 in total and the width of the electrode unit 40 of the parallel arm 4 are compared to each other, and the right and left outside ends having a narrower width are positioned in the inside of those having a wider width. Through such an arrangement like this, further creation of an empty space due to bulging out of the outside ends of the narrower width electrode units 20 through 40 toward outer of the outside ends of the wider width electrode units 20 through 40 can be avoided.

In addition, even when an empty space is created due to unevenness of the size (size of the installation area) of the electrode units 20 through 40, the size of the empty space can be controlled within a prescribed tolerance ratio, for instance, by the following steps.

(Step 1) the size ($L_T$ in width×$H_T$ in height) of a rectangular area within which the three SAW resonators 2 through 4 can be housed is determined.

(Step 2) the ratio of a tolerable empty space (tolerable ratio of an empty space) to the rectangular area established by (step 1) is established.

(Step 3) the size ($L_{21}$ in width×$H_{21}$ in height) of the electrode unit 20 of the first series arm 2, the size ($L_{22}$ in width× $H_{22}$ in height) of the electrode unit 30 of the second series arm 3, and the size ($L_{23}$ in width×$H_{23}$ in height) of the electrode unit 40 of the parallel arm 4 are designed based on a specification.

(Step 4) the designed sizes of the respective electrode units 20 to 40 are confirmed whether they satisfy the following equation (1).

$$(H_T \times L_T - \Sigma(H_{2n} \times L_{2n}))/(H_T \times L_T) \leq x \quad (1)$$

(n=1, 2, 3)

Here, $H_T$: any larger value out of $H_{21}+H_{23}$, and $H_{22}+H_{23}$ $L_T$: any larger value out of $L_{21}+L_{22}$, and $L_{23}$ x: empty space tolerable ratio (Step 5) when a result satisfying the equation (1) is obtained, the designing is finished, and when not satisfying the equation (1), (step 3 to step 4) are repeated till the result is settled.

(Step 6) when the result of (step 5) is not settled, the size ($L_T$ in width×$H_T$ in height) of the rectangular area is changed, and (step 1) through (step 5) are repeated.

Note that even when the following equation (1)' is used instead of the above described equation (1), a similar result can be obtained.

$$\Sigma(H_{2n} \times L_{2n})/(H_T \times L_T) \geq 1-x \quad (1)$$

(n=1 2, 3)

In the arrangement pattern of the SAW resonators 2 through 4 designed by the above-described steps, the ratio of an area occupied by the electrode units 20 through 40 of the whole three SAW resonators 2 through 4; to a rectangular area surrounded by (1) an extension line of an edge projecting more ahead out of the electrode units 20 and 30 of the first series arm 2 and the second series arm 3 on the front; (2) extension lines of the right and left outside ends positioned outer out of the right, left outside ends of the electrode units 20, 30 of these two series arms 2, 3 in total and the right and left outside ends of the electrode 40 of the parallel arm 4 on the rear side; and (3) an extension line of the edge on the rear side of the electrode unit 40 of the parallel arm 4, is a prescribed value of "1−x" or more. As a result, it is possible to obtain the resonator module 1 having a specified performance while controlling the value of the empty space within the tolerance ratio "x". The empty space tolerance ratio is preferably, for instance, 0.2 or less.

Figure 3:
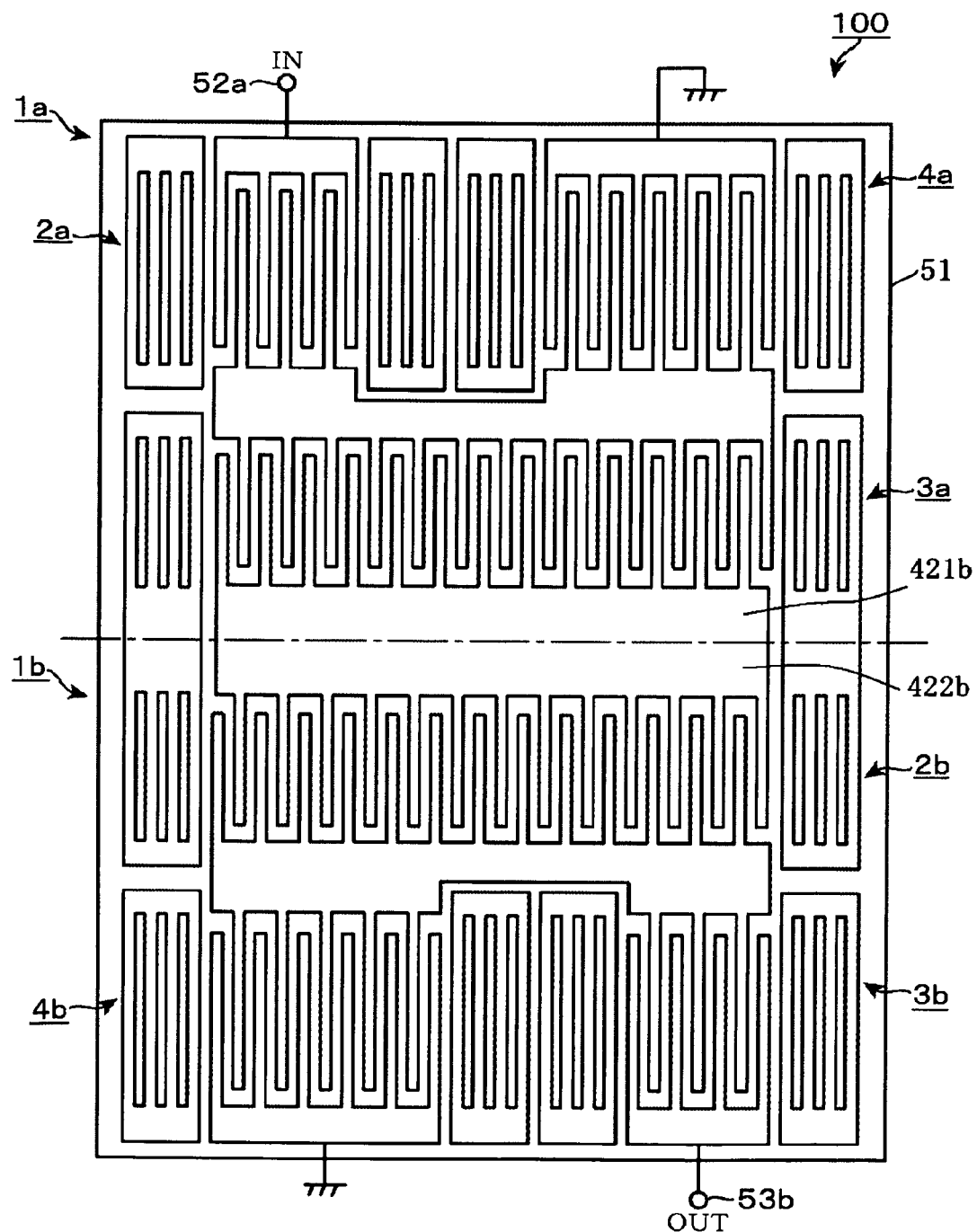
FIG. 3 is a plan view of a ladder type filter formed above a common piezoelectric substrate having a plurality of IDT electrodes.

The resonator module 1 designed in this manner is configured in a manner that by patterning an IDT electrode composing two resonator modules 1a and 1b above the common piezoelectric substrate 51, for instance, as shown in FIG. 3, and further connecting sixth bus bars 421b and 422b with each other respectively while making them in common so as to extend the sixth bus bar 421b of a first resonator module 1a (shown on the front side in FIG. 3) and the sixth bus bar 422b of a second resonator module 1b (on the rear side in FIG. 3) in parallel while adjacent to each other, so that these resonator modules 1a and 1b can be formed in an integral unit. Then, by connecting a first series arm 2a of the first resonator module 1a to an input port 52a, and by connecting a second series arm 3b of the second resonator module 1b to an output port 53b, it becomes possible to configure a ladder type filter 100 in which constant-K circuits forming the respective resonator modules 1a and 1b are connected in a ladder type in one chip as shown in a circuit diagram in FIG. 4. In addition, by increasing the number of the resonator modules 1 formed above the piezoelectric substrate 51, a ladder type filter 100 containing further more constant-K circuits can be formed by connecting these resonator modules in series. Note that a method of arranging respective series arms 2a, 2b, 3a, 3b and the parallel arms 4a, 4b in the first and second resonator modules 1a and 1b will be described later in an explanation of FIGS. 6A and 6B.

Figure 4:
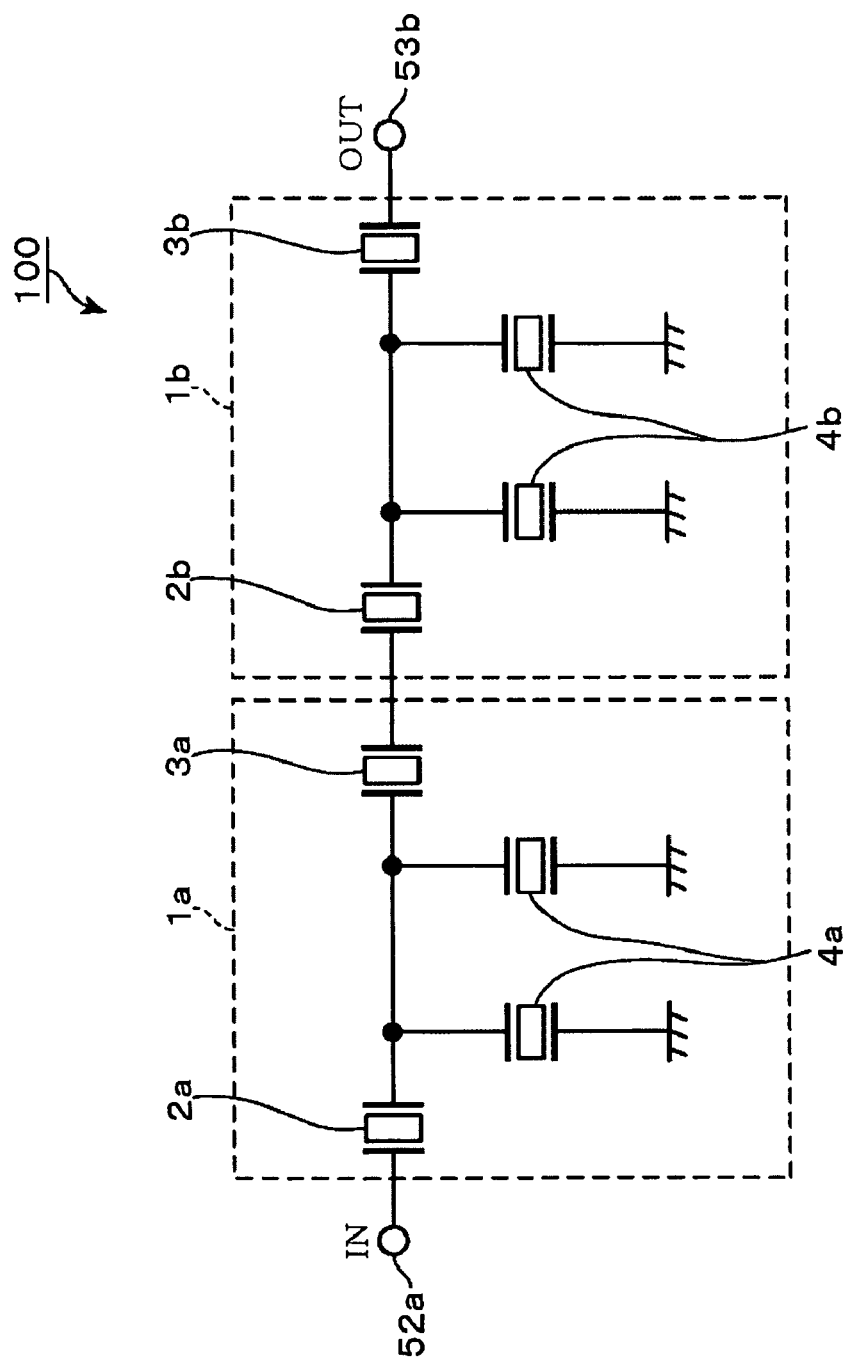
FIG. 4 is a circuit diagram of the above-described ladder type filter.
Figure 5:
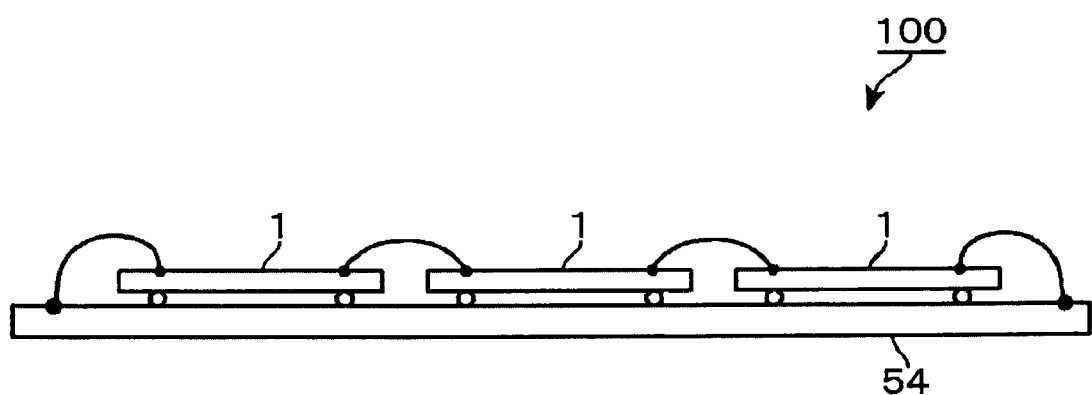
FIG. 5 is an explanatory diagram for a ladder type filter with a plurality of resonator modules installed above a wiring substrate.

A method of configuring the ladder type filter 100 is not limited to examples shown in FIG. 3 and FIG. 4, and it is possible to configure the ladder type filter 100 in which the constant-K circuits are connected in a ladder type by, for instance, manufacturing the respective resonator modules 1 shown in FIG. 1 in small chips, by installing plural pieces of these resonator modules 1 on a common wiring substrate 54 in a row as shown in FIG. 5, and by bonding the respective output port 53 and input port 52.

According to the embodiment of the present invention explained above can obtain the following effects. The bus bars (the second bus bar 22b, the fourth bus bar 32b and the fifth bus bar 42a) of the respective SAW resonators 2 through 4 can be made close to each other by arranging two SAW resonators (the first series arm 2 and the second series arm 3) among three SAW resonators 1 through 3 composing series arms and a parallel arm of the elastic wave filter in the lateral direction side by side and placing the other one (parallel arm 4) on the rear side of the row. As a result, a common bus bar 10 is configured by making a connection point of these bus bars in common, so that the common bus bar 10 can be used as a signal line. Accordingly, it becomes possible to cancel the empty spaces S1 and S2 shown in FIG. 10 and can realize further downsizing of the resonator module 1.

In addition, by using the common bus bar 10 as the signal line, it becomes unnecessary to route through a wide and long signal line as in the conventional way, which makes it possible to prevent a signal loss due to the ohmic loss on a part of the signal line, or deterioration of a pass band of the filter due to increase of parasitic capacitance so that it contributes to improvement in performance of the filter.

Figure 6:
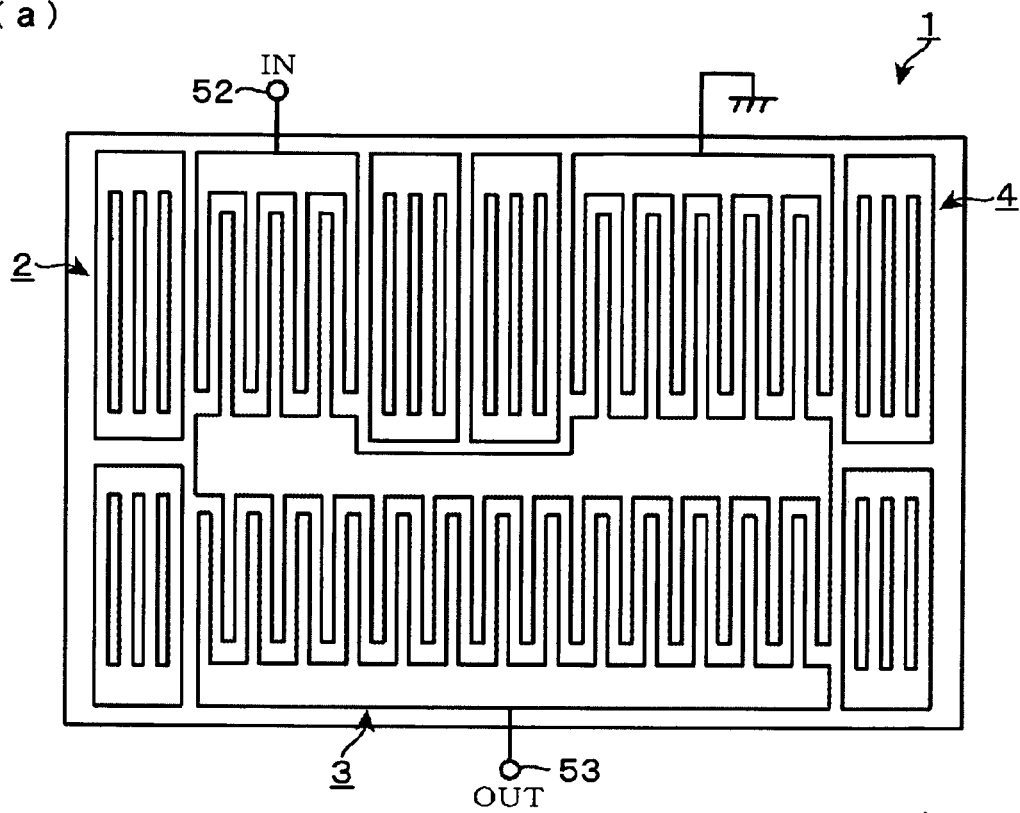
FIGS. 6A and 6B are plan views showing a second modified example of the resonator module.
Figure 6:
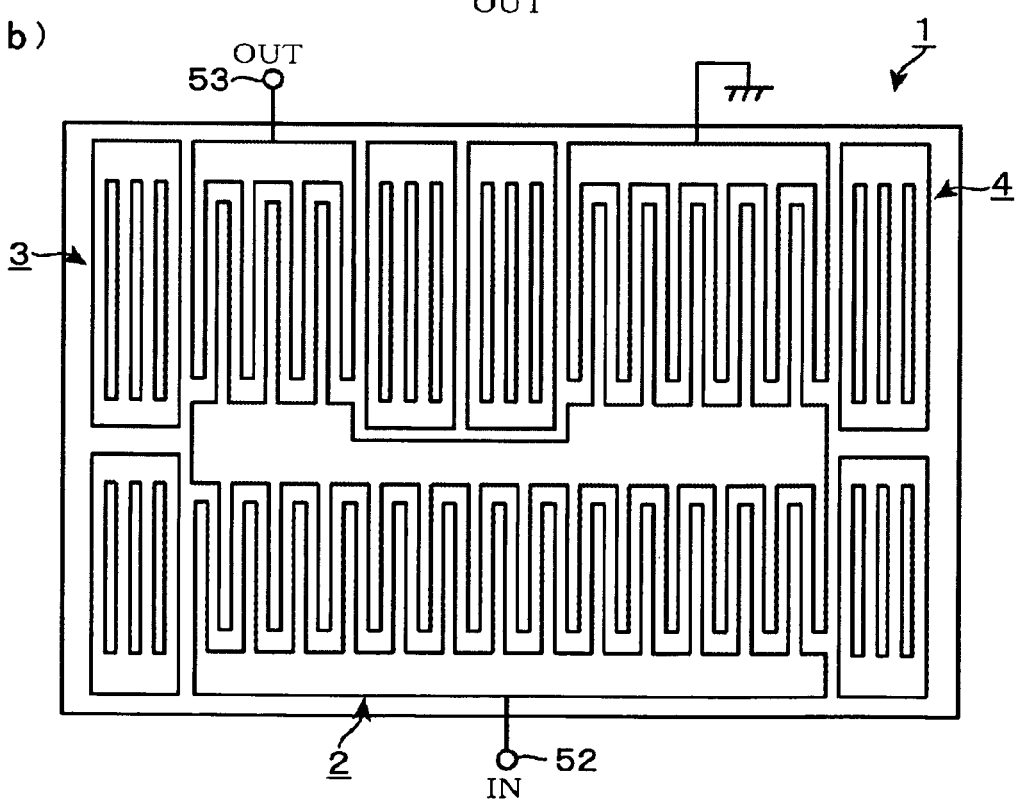

Note that though in the resonator module 1 shown in FIG. 1, FIG. 2A and FIG. 2B, an example of arranging the first series arm 2 and the second series arm 3 laterally on the front side and disposing the parallel arm 4 at the rear of this row is shown, the SAW resonators 2 to 3 to be disposed on the front side and the rear side respectively are not limited to this pattern. For instance, the first series arm 2 and the parallel arm 4 may be arranged on the front side in a row, and the second series arm 3 may be arranged on the rear side as shown in FIG. 6A, or the first series arm 2 may be disposed on the rear side as shown in FIG. 6B.

Here, from a view point of preventing creation of an empty space, and reducing of the ohmic loss or the parasitic capacitance, it is preferable to use the common bus bar 10 for the signal line, but if necessary, it is possible that the respective pass bars (the second bus bar 22b, the fourth bus bar 32b and the fifth bus bar 42a) are not made in common, and the signal line is provided separately to connect at a common connection point. Since these bus bars 22b, 32b and 42a are arranged at positions close to each other by selecting the previously-described arrangement pattern relating to the embodiment, it becomes possible to control the length of the signal line to a required minimum and to suppress an empty space, the ohmic loss and increase of the parasitic capacitance.

When alignment marks 133a through 133d, a finish-recognition pattern 134, and an identification code 135 explained in the conventional example in FIG. 10 are arranged, these may be disposed in empty spaces shown in FIG. 2A and FIG. 2B for instance. When there is almost no empty space as in FIG. 1, the piezoelectric substrate 51 may be made a size larger so as to arrange these members, and the alignment marks 133a through 133d and the identification code 135 may be printed, for instance, at the corners or the like of the reflectors 24a, 34b, 44a and 44b corresponding to four corners of the piezoelectric substrate 51 shown in FIG. 1. In addition, in the embodiment, the case of forming the SAW resonators 2 through 4 above the piezoelectric substrate 51 made of $LiTaO_3$, $LiNbO_3$, $SiO_2$ or the like is illustrated. But the configuration of the piezoelectric substrate 51 is not limited to this example. For instance, an example in which a piezoelectric thin film layer is formed above a glass substrate or the like is also included in the piezoelectric substrate of the present invention.

In addition, though the case of adopting the SAW resonator as an elastic wave resonator is explained in the above-described respective embodiments, the kind of the elastic wave resonator applicable to the present invention is not limited to this kind. For instance, an elastic wave resonator in a type of applying elastic boundary waves is also acceptable.

EXAMPLES

Filter models having similar configurations to the resonator modules 1 and 110 shown in FIG. 1 and FIG. 10 respectively are prepared, and the filter characteristics of the respective filter models are simulated.

(Simulation 1)
The ohmic loss created in the common bus bar 10 and the signal line 132 are fixed, and the influence of the parasitic capacitance generated among them on the passing characteristics of the filter is studied.

Example 1

The passing characteristics of the resonator module 1 shown in FIG. 1 are simulated.
The conditions of the simulation
piezoelectric substrate: $LiTaO_3$
chip size: 1.2 mm×0.5 mm Comparison Example 1

Figure 7:
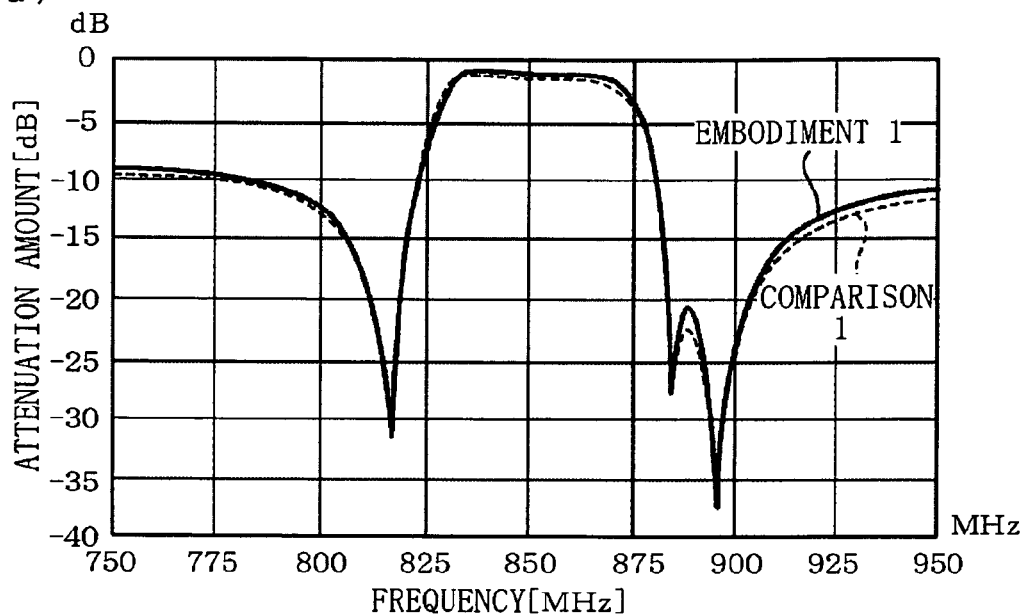
FIGS. 7A and 7B are characteristic charts showing passing characteristics of an elastic wave filter relating to the embodiment.
Figure 7:
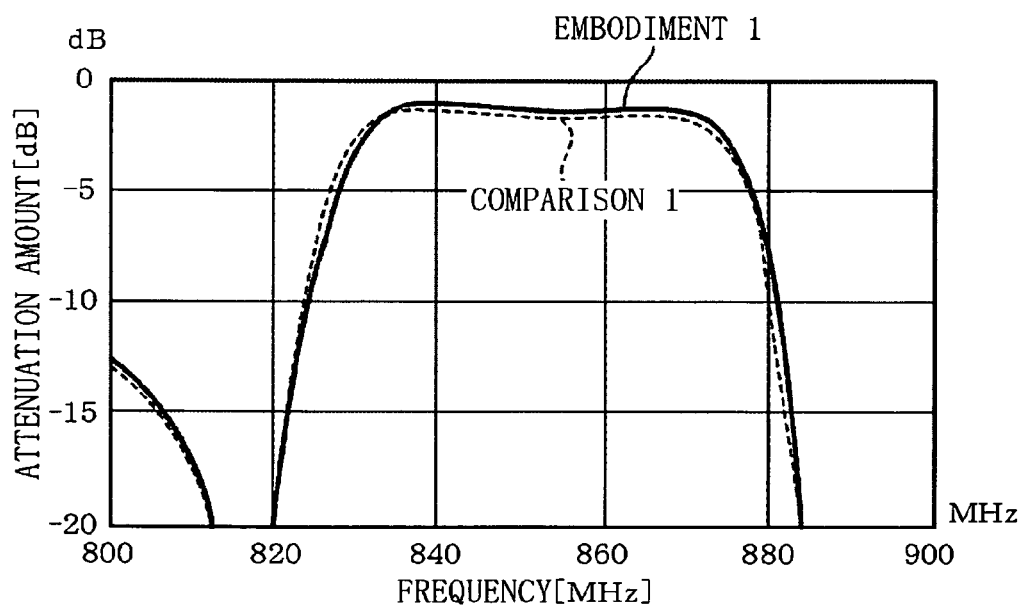

The passing characteristics of the resonator module 110 shown in FIG. 10 are simulated.
The conditions of the simulation
piezoelectric substrate: $LiTaO_3$
chip size: 1.0 mm×1.5 mm
(The Result of the Simulation)
The simulation result is shown in FIG. 7A and FIG. 7B.
FIG. 7A is an all over view of the passing characteristics of the respective resonator modules 1 and 110, and FIG. 7B shows an enlarged view of the passing characteristics in the pass band. The horizontal axes of the respective drawings are frequencies [MHz], the vertical axes are attenuation amounts [dB], a solid line in the drawing indicates the simulation result of (Example 1), and a broken line indicates the simulation result of Comparison Example 1

As shown in FIG. 7A, (Example 1) and (Comparison Example 1) show similar passing characteristics as a whole. However, when looking the enlarged view of the pass band in FIG. 7B, a depression is found in the attenuation amount of (Comparison Example 1) at the central part of the pass band compared with (Example 1). This is considered to be due to a difference caused by the ohmic loss created by routing through the wide and long signal line 132 shown in FIG. 10. Note that when (Example 1) and (Comparison Example 1) are visually compared on FIG. 7B, it appears that the difference in attenuation amount is a little, but this is because the attenuation amount is expressed in decibel in this drawing. However, the difference taken as a difference in input and output of an electric signal is considerably large. Therefore, this leads to a large difference in battery life of a mobile terminal.

(Simulation 2)
The parasitic capacitance created in the common bus bar 10 and the signal line 132 are fixed, and the influence of the ohmic loss generated among them on the passing characteristics of the filter is studied.

Example 2

The passing characteristics of the resonator module 1 shown in FIG. 1 are simulated.
The conditions of the simulation
piezoelectric substrate: $LiTaO_3$
chip size: 1.2 mm×0.5 mm Comparison Example 2

Figure 8:
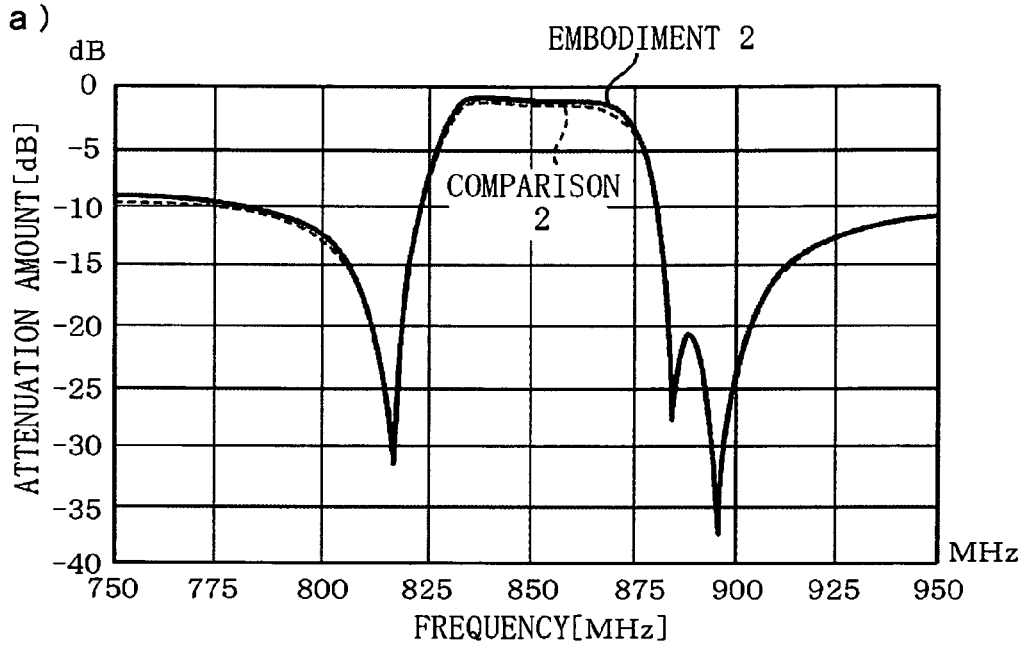
FIGS. 8A and 8B are second characteristic charts showing the passing characteristics of the elastic wave filter.
Figure 8:
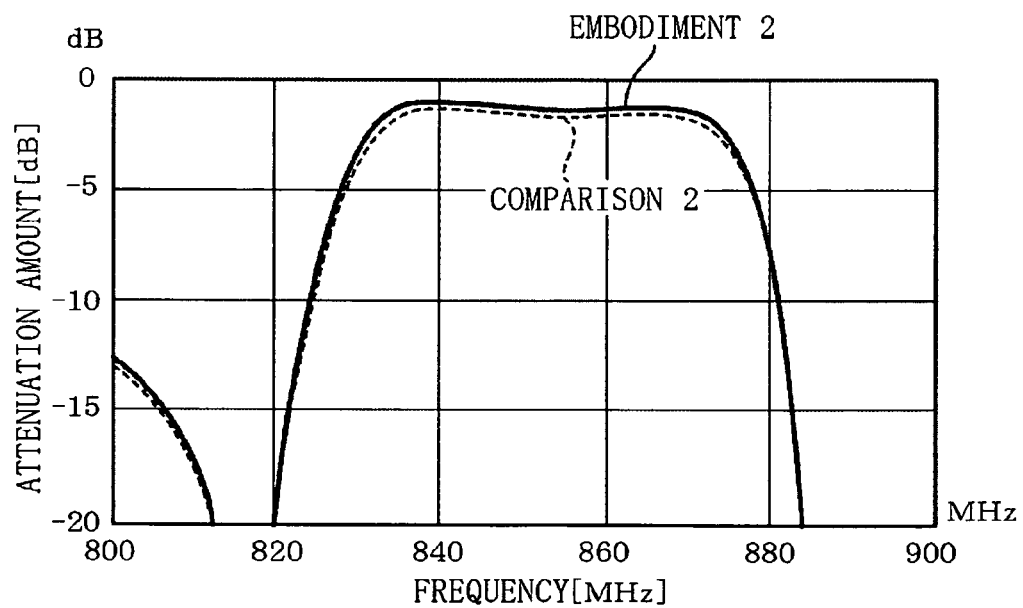

The passing characteristics of the resonator module 110 shown in FIG. 10 are simulated.
The conditions of the simulation
piezoelectric substrate: $LiTaO_3$
chip size: 1.0 mm×1.5 mm
(The Result of the Simulation)
The simulation result is shown in FIG. 8A and FIG. 8B.
FIG. 8A is an all over view of the passing characteristics of the respective resonator modules 1 and 110, and FIG. 8B shows an enlarged view of the passing characteristics in the pass band. A solid line in the drawing indicates the simulation result of (Example 2), and a broken line indicates the simulation result of (Comparison Example 2), and the horizontal axes and the vertical axes are the same as those in FIG. 7A and FIG. 7B.

As can be understood from the results shown in FIGS. 8A and 8B, a difference in attenuation amount is seen at the central part of the pass band between (Example 2) and (Comparison Example 2). This result comes from a difference in parasitic capacitance generated in the signal line 132 and the common bus bar 10 is created between the conventional module 110 which routes through the long signal line 132 and the resonator module 1 relating to the embodiment, to which the function of a signal line is given to the common bus bar 10.

What is claimed is:

1. An elastic wave filter provided with a circuit above a piezoelectric substrate wherein the piezoelectric substrate extends in a front/rear direction from a front position to a rear position and extends in a lateral direction between a left lateral position to a right lateral position, the circuit comprising:

a first series arm elastic wave resonator, a second series arm elastic wave resonator and a parallel arm elastic wave resonator connected to a common connection point;

said first series arm elastic wave resonator including a first bus bar and a second bus bar opposing one another along the front/rear direction and a first IDT electrode provided between the first bus and the second bus bar;

one out of said second series arm elastic wave resonator and said parallel arm elastic wave resonator being disposed adjacent the first series arm elastic wave resonator in a row extending along the lateral direction, and including a third bus bar and a fourth bus bar opposing one another along the front/rear direction and a second IDT electrode provided between the third and fourth bus bars, and at least part of the fourth bus bar being disposed at an area within a virtual extension of the second bus bar in the lateral direction;

another one out of said second series arm elastic wave resonator and said parallel arm elastic wave resonator including a fifth bus bar and a sixth bus bar opposing one another along the front/rear direction, and a third IDT electrode provided between the fifth and sixth bus bars;

said another one of said second series arm elastic wave resonator and said parallel arm elastic wave resonator being positioned on a rear side of the row having said first series arm elastic wave resonator and the one out of said second series arm elastic wave resonator and said parallel arm elastic wave resonator such that said third IDT extends in the lateral direction from a first IDT end to a second IDT end so as to have:

a first portion rearward of the first IDT along an axis parallel the front/rear direction and intersecting the first IDT; and a second portion rearward of the second IDT along another axis parallel the front/rear direction and intersecting the second IDT, said fifth bus bar extends laterally from a first fifth bus bar portion adjoining said first portion of said third IDT to a second fifth bus bar portion adjoining said second portion of said third IDT; and said fifth bus bar being formed adjoined to said second bus bar at said first fifth bus bar portion and formed adjoined to said fourth bus bar at said second fifth bus bar portion so as to bridge said second and fourth bus bars;

taking a constant-K circuit composed of the series arm elastic wave resonator and the parallel arm elastic wave resonator as a base section, and connecting two or more of the base section in a ladder type;

making the series arm elastic wave resonator contained in a first base section where said parallel arm elastic wave resonator is positioned on the output side, serve as said first series elastic wave resonator; and making the series arm elastic wave resonator adjacent to the first base section, and contained in a second base section where said parallel arm elastic wave resonator is positioned on the input side serve as said second series arm elastic wave resonator.

2. The elastic wave filter according to claim 1, wherein said first series arm elastic wave resonator and said second series arm elastic wave resonator are arranged in a row in the lateral direction; and said parallel arm elastic wave resonator contained in the base section is arranged on the rear side of the row of said first series arm elastic wave resonator and said second series arm elastic wave resonator.

3. An elastic wave filter unit provided with a circuit above a piezoelectric substrate wherein the piezoelectric substrate extends in a front/rear direction from a front position to a rear position and extends in a lateral direction between a left lateral position to a right lateral position, the circuit comprising:

a first series arm elastic wave resonator a second series arm elastic wave resonator and a parallel arm elastic wave resonator connected to a common connection point;

said first series arm elastic wave resonator including a first bus bar and a second bus bar opposing one another along the front/rear direction and a first IDT electrode provided between the first bus and the second bus bar;

one out of said second series arm elastic wave resonator and said parallel arm elastic wave resonator being disposed adjacent the first series arm elastic wave resonator in a row extending along the lateral direction, and including a third bus bar and a fourth bus bar opposing one another along the front/rear direction and a second IDT electrode provided between the third and fourth bus bars, and at least part of the fourth bus bar being disposed at an area within a virtual extension of the second bus bar in the lateral direction;

another one out of said second series arm elastic wave resonator and said parallel arm elastic wave resonator including a fifth bus bar and a sixth bus bar opposing one another along the front/rear direction, and a third IDT electrode provided between the fifth and sixth bus bars;

said another one of said second series arm elastic wave resonator and said parallel arm elastic wave resonator being positioned on a rear side of the row having said first series arm elastic wave resonator and the one out of said second series arm elastic wave resonator and said parallel arm elastic wave resonator such that said third IDT extends in the lateral direction from a first IDT end to a second IDT end so as to have:

a first portion rearward of the first IDT along an axis parallel the front/rear direction and intersecting the first IDT; and a second portion rearward of the second IDT along another axis parallel the front/rear direction and intersecting the second IDT, said fifth bus bar extends laterally from a first fifth bus bar portion adjoining said first portion of said third IDT to a second fifth bus bar portion adjoining said second portion of said third IDT;

said fifth bus bar being formed adjoined to said second bus bar at said first fifth bus bar portion and formed adjoined to said fourth bus bar at said second fifth bus bar portion so as to bridge said second and fourth bus bars;

a first elastic wave filter comprised of said elastic wave filter unit; and a second elastic wave filter comprised of said elastic wave filter unit, wherein said first elastic wave filter and said second elastic wave filter are connected to each other.

4. The elastic wave filter according to claim 3, wherein these elastic wave filters are arranged in a manner that the sixth bus bar provided on said first plastic wave filter and the sixth bus bar provided on said second elastic wave filter are extended in parallel adjacent to each other, and the sixth bus bars of the respective elastic wave filters are connected to each other.

5. The elastic wave filter according to claim 4, where the sixth bus bar of said first elastic wave filter and the sixth bus bar of said second elastic wave filter are made in common.

6. The elastic wave filter according to claim 3, wherein the whole IDT electrodes and the bus bars of said first elastic wave filter and said second elastic wave filter are provided on a common piezoelectric substrate.

7. An elastic wave filter provided with a circuit in which a first series arm elastic wave resonator, a second series arm elastic wave resonator and a parallel arm elastic wave resonator are connected to a common connection point, comprising:

configuring said first series arm elastic wave resonator with a first bus bar and a second bus bar provided above a piezoelectric substrate in front and behind while facing each other, and an IDT electrode provided between these bus bars;

one out of said second series arm elastic wave resonator and said parallel arm elastic wave resonator, which includes a third bus bar and a fourth bus bar provided above the piezoelectric substrate in front and behind while facing each other and the IDT electrode provided between these bus bars, and which is positioned adjacent to said first series arm elastic wave resonator in the lateral direction; and the other out of said second series arm elastic wave resonator and said parallel arm elastic wave resonator, which includes a fifth bus bar and a sixth bus bar provided above the piezoelectric substrate in front and behind while facing each other and the IDT electrode provided between these bus bars, and which is positioned on the rear side of a row composed together with said first series arm elastic wave resonator and the one out of said second series arm elastic wave resonator and said parallel arm elastic wave resonator, wherein the second bus bar, the fourth bus bar and the fifth bus bar are positioned on the common connection point side, and wherein;

the circuit composed of the first series arm elastic wave resonator, the second series arm elastic wave resonator and the parallel arm elastic wave resonator is configured as a resonator module using a piezoelectric substrate for modules; and the filter is configured by installing a plurality of the resonator modules above a wiring substrate.

8. An elastic wave filter provided with a circuit above a piezoelectric substrate wherein the piezoelectric substrate extends in a front/rear direction from a front position to a rear position and extends in a lateral direction between a left lateral position to a right lateral position, the circuit comprising:

a first series arm elastic wave resonator, a second series arm elastic wave resonator and a parallel arm elastic wave resonator connected to a common connection point;

said first series arm elastic wave resonator including a first bus bar and a second bus bar opposing one another along the front/rear direction and a first IDT electrode provided between the first bus and the second bus bar;

one out of said second series arm elastic wave resonator and said parallel arm elastic wave resonator being disposed adjacent the first series arm elastic wave resonator in a row extending along the lateral direction, and including a third bus bar and a fourth bus bar opposing one another along the front/rear direction and a second IDT electrode provided between the third and fourth bus bars, and at least part of the fourth bus bar being disposed at an area within a virtual extension of the second bus bar in the lateral direction;

another one out of said second series arm elastic wave resonator and said parallel arm elastic wave resonator including a fifth bus bar and a sixth bus bar opposing one another along the front/rear direction and a third IDT electrode provided between the fifth and sixth bus bars;

said another one of said second series arm elastic wave resonator and said parallel arm elastic wave resonator being positioned on a rear side of the row having said first series arm elastic wave resonator and the one out of said second series arm elastic wave resonator and said parallel arm elastic wave resonator such that said third IDT extends in the lateral direction from a first IDT end to a second IDT end so as to have:

a first portion rearward of the first IDT along an axis parallel the front/rear direction and intersecting the first IDT; and a second portion rearward of the second IDT along another axis parallel the front/rear direction and intersecting the second IDT, and said fifth bus bar extends laterally from a first fifth bus bar portion adjoining said first portion of said third IDT to a second fifth bus bar portion adjoining said second portion of said third IDT;

said fifth bus bar being formed adjoined to said second bus bar at said first fifth bus bar portion and formed adjoined to said fourth bus bar at said second fifth bus bar portion so as to bridge said second and fourth bus bars;

wherein each of the first series arm elastic wave resonator, second series arm elastic wave resonator, and the parallel arm elastic wave resonators include reflectors and serve as an electrode unit, and a ratio of a sum of areas of disposing areas of the electrode unit of each of these respective elastic wave resonators to an area of a rectangular area where the electrode units of the first series arm elastic wave resonator, the second series arm elastic wave resonator and the parallel arm elastic wave resonator are housed is 0.8 or more.

9. An elastic wave filter provided with a circuit above a piezoelectric substrate wherein the piezoelectric substrate extends in a front/rear direction from a front position to a rear position and extends in a lateral direction between a left lateral position to a right lateral position, the circuit comprising:

a first series arm elastic wave resonator, a second series arm elastic wave resonator and a parallel arm elastic wave resonator connected to a common connection point;

said first series arm elastic wave resonator including a first bus bar and a second bus bar opposing, one another along the front/rear direction and a first IDT electrode provided between the first bus and the second bus bar;

one out of said second series arm elastic wave resonator and said parallel arm elastic wave resonator being disposed adjacent the first series arm elastic wave resonator in row extending along the lateral direction, and including a third bus bar and a fourth bus bar opposing one another along the front/rear direction and a second IDT electrode provided between the third and fourth bus bars, and at least part of the fourth bus bar being disposed at an area within a virtual extension of the second bus bar in the lateral direction;

another one out of said second series arm elastic wave resonator and said parallel arm elastic wave resonator including a fifth bus bar and a sixth bus bar opposing one another along the front/rear direction, and a third IDT electrode provided between the fifth and sixth bus bars;

said another one of said second series arm elastic wave resonator and said parallel elastic wave resonator being positioned on a rear side of the row having said first series arm elastic wave resonator and the one out of said second series arm elastic wave resonator and said parallel arm elastic wave resonator such that said third IDT extends in the lateral direction from a first IDT end to a second IDT end so as to have:

a first portion rearward of the first IDT along an axis parallel the front/rear direction and intersecting the first IDT; and a second portion rearward of the second IDT along another axis parallel the front/rear direction and intersecting the second IDT, and said fifth bus bar extends laterally from a first fifth bus bar portion adjoining said first portion of said third IDT to a second fifth bus bar portion adjoining said second portion of said third IDT;

said fifth bus bar being formed adjoined to said second bus bar at said first fifth bus bar portion and formed adjoined to said fourth bus bar at said second fifth bus bar portion so as to bridge said second and fourth bus bars;

wherein each of the first series arm elastic wave resonator, the second series arm elastic wave resonator, and the parallel arm elastic wave resonator include left side and right side reflectors disposed adjacent respective opposing left and right lateral sides of the respective ones of the first, second and third IDT's;

said left side reflector of said another one of said second series arm elastic wave resonator and said parallel arm elastic wave resonator being disposed rearward of said left side reflector of said first series arm elastic wave resonator along an axis parallel the front/rear direction and intersecting said left side reflector of said first series arm elastic wave resonator; and said right side reflector of said another one of said second series arm elastic wave resonator and said parallel arm elastic wave resonator being disposed rearward of said right side reflector of said one of said second series arm elastic wave resonator and said parallel arm elastic wave resonator along an axis parallel the front/rear direction and intersecting said right side reflector of said one of said second series arm elastic wave resonator and said parallel arm elastic wave resonator.

10. An elastic wave filter provided with a circuit above a piezoelectric substrate wherein the piezoelectric substrate extends in a front/rear direction from a front position to a rear position and extends in a lateral direction between a left lateral position to a right lateral position, the circuit comprising:

a first series arm elastic wave resonator a second series arm elastic wave resonator and a parallel arm elastic wave resonator connected to a common connection point;

said first series arm elastic wave resonator including a first bus bar and a second bus bar opposing one another along the front/rear direction and a first IDT electrode provided between the first bus and the second bus bar;

one out of said second series arm elastic wave resonator and said parallel arm elastic wave resonator being disposed adjacent first series arm elastic wave resonator in a row extending along the lateral direction, and including a third bus bar and a fourth bus bar opposing one another along the front/rear direction and a second IDT electrode provided between the third and fourth bus bars, and at least part of the fourth bus bar being disposed at an area within extension of the second bus bar in the lateral direction;

another one out of said second series arm elastic wave resonator and said parallel arm elastic wave resonator including a fifth bus bar and a sixth bus bar opposing one another along the front/rear direction, and a third IDT electrode provided between the fifth and sixth bus bars;

said another one of said second series arm elastic wave resonator and said parallel arm elastic wave resonator being positioned on a rear side of the row having said first series arm elastic wave resonator and the one out of said second series arm elastic wave resonator and said parallel arm elastic wave resonator such that said third IDT extends in the lateral direction from a first IDT end to a second IDT end so as to have:

a first portion rearward of the first IDT along an axis parallel the front/rear direction and intersecting the first IDT; and a second portion rearward of the second IDT along another axis parallel the front/rear direction and intersecting the second IDT, and said fifth bus bar extends laterally from a first fifth bus bar portion adjoining said first portion of said third IDT to a second fifth bus bar portion adjoining said second portion of said third IDT;

said fifth bus bar being formed adjoined to said second bus bar at said first fifth bus portion and formed adjoined to said fourth bus bar at said second fifth bus bar portion so as to bridge said second and fourth bus bars;

wherein a circuit composed of the first series arm elastic wave resonator, the second series arm elastic wave resonator and the parallel arm elastic wave resonator is configured as a resonator module using a piezoelectric substrate for modules; and the filter is configured by installing a plurality of the resonator modules above a wiring substrate.

* * * * *